(12) United States Patent
Weber

(10) Patent No.: US 6,647,641 B1
(45) Date of Patent: Nov. 18, 2003

(54) DEVICE AND METHOD FOR THE TREATMENT OF SUBSTRATES IN A FLUID CONTAINER

(75) Inventor: Martin Weber, Elzach (DE)

(73) Assignee: Steag MicroTech GmbH (DE)

( * ) Notice: Subject to any disclaimer, the term of this patent is extended or adjusted under 35 U.S.C. 154(b) by 0 days.

(21) Appl. No.: 09/367,683

(22) PCT Filed: Feb. 14, 1998

(86) PCT No.: PCT/EP98/00853

§ 371 (c)(1),
(2), (4) Date: Dec. 3, 1999

(87) PCT Pub. No.: WO98/36443

PCT Pub. Date: Aug. 20, 1998

(30) Foreign Application Priority Data

Feb. 17, 1997 (DE) .......................................... 197 06 072

(51) Int. Cl.[7] .................................................. F26B 3/00
(52) U.S. Cl. .............................. 34/451; 34/467; 34/614; 134/902; 414/937; 414/938
(58) Field of Search .............................. 34/68, 72, 451, 34/467, 614, 615; 414/935, 936, 937, 938; 134/902

(56) References Cited

U.S. PATENT DOCUMENTS

| | | | |
|---|---|---|---|
| 4,840,530 A | 6/1989 | Nguyen | |
| 5,156,174 A | * 10/1992 | Thompson et al. | 134/153 |
| 5,431,179 A | * 7/1995 | Miyazaki et al. | 134/61 |
| 5,569,330 A | * 10/1996 | Schild et al. | 134/1 |
| 5,950,327 A | * 9/1999 | Peterson et al. | 34/328 |
| 5,954,068 A | * 9/1999 | Weber et al. | 134/25.4 |

FOREIGN PATENT DOCUMENTS

| | | |
|---|---|---|
| DE | 44 13 077 | 10/1995 |
| DE | 195 46 990 | 7/1996 |
| DE | 44 25 208 | 10/1996 |
| EP | 0 385 536 | 9/1990 |
| EP | 0 658 923 | 6/1995 |
| JP | 61-12 1337 | 6/1986 |
| JP | 61-140148 | 6/1986 |
| JP | 6216102 | 8/1994 |
| JP | 7106292 | 4/1995 |
| WO | WO 96/21241 | 7/1996 |

* cited by examiner

Primary Examiner—Ira S. Lazarus
Assistant Examiner—Kathryn S. O'Malley
(74) Attorney, Agent, or Firm—R W Becker & Associates; R W Becker

(57) ABSTRACT

A device for the treatment of substrates has a fluid container and two substrate transport devices positionable above the fluid container. Each substrate transport device is a hood for receiving multiple substrates. Each substrate transport device has at least one substrate support device having a first position for locking the substrates and a second position for releasing the substrates. The substrate transport devices are rigidly connected to one another and linearly movable for alternatingly positioning one of the substrate transport devices above the fluid container.

18 Claims, 1 Drawing Sheet

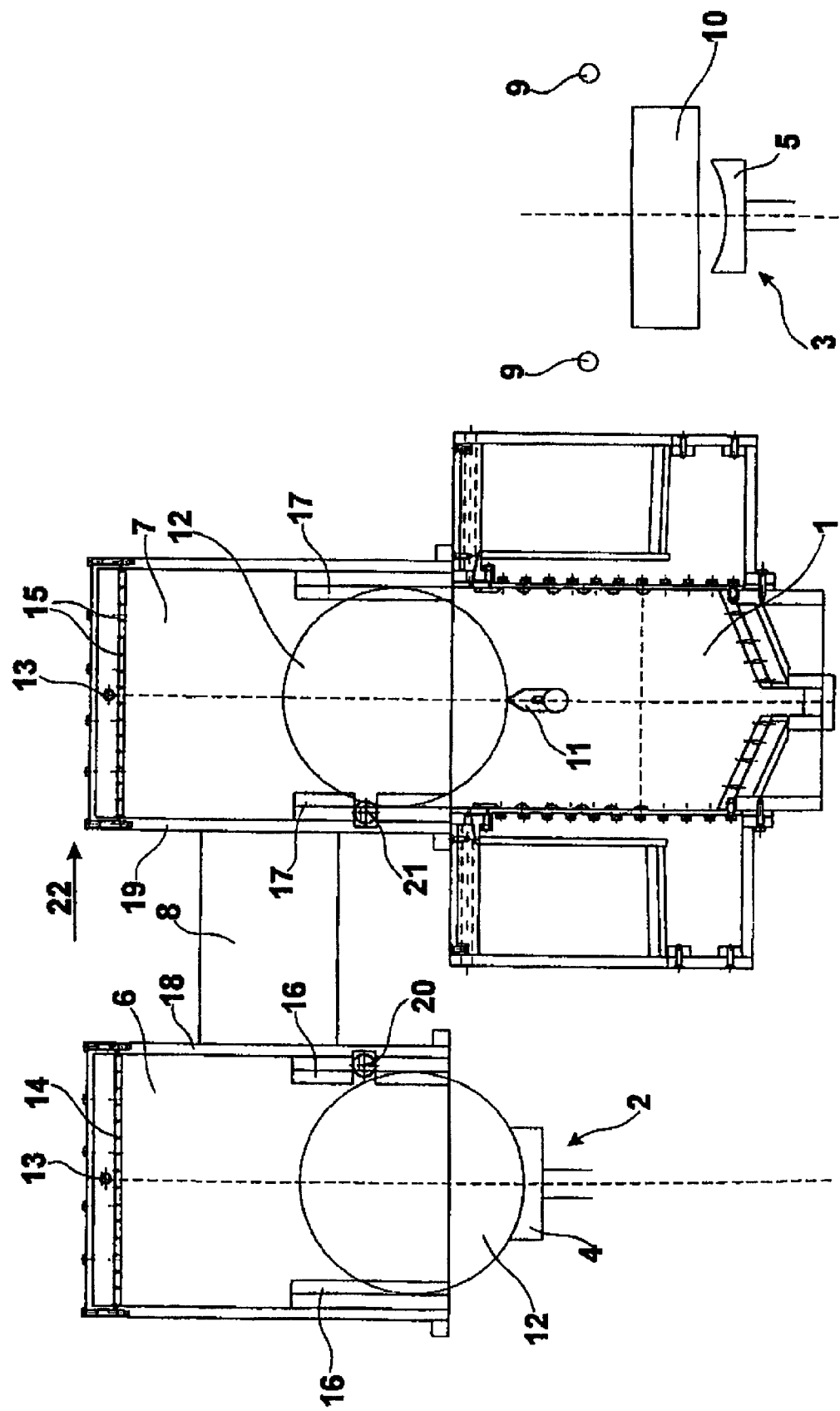

ated kind is known from DE
DEVICE AND METHOD FOR THE TREATMENT OF SUBSTRATES IN A FLUID CONTAINER

BACKGROUND OF THE INVENTION

The invention concerns a method for the treatment of substrates in a fluid container comprising a first substrate transport device that can be positioned above the fluid container and has at least one substrate support device that locks the substrates in a first position and releases them in a second position. Furthermore, the invention concerns a method for the transport of substrates.

A device of the aforementioned kind is known from DE 44 13 077 A of the same applicant. With this known device, the loading of the substrates to be treated into the substrate transport device and the removal of the treated substrates from the substrate transport device is complicated in regard to the process expenditures and, in particular, in regard to the necessary expenditure of time, so that the productivity of the known device is limited.

From DE 195 46 990 A of the same applicant, a device for chemical wet treatment of substrates is known, wherein the substrates are lifted and lowered by a vertically moving first transport carriage. A second transport carriage for a carrier holding the substrates is provided and is movable relative to the first transport carrier moving the substrates. This known device is not concerned with the guiding and lifting of the substrates into and out of the fluid container without a carrier.

EP 0 385 536 A shows and describes a device for loading and removing of substrates into and/or out of a carrier that is positioned in a fluid container. The carrier itself is lifted out of the fluid container after the substrates have been removed.

From DE 44 25 208 A, a device for coupling loading and unloading devices with machines for the treatment of semiconductors is known, wherein an adjustable receiving element for the loading and unloading device is provided inside a movable enclosure that is adjustable between at least two planes positioned above another, wherein the enclosure comprises aligning and supporting elements for the attachment to a coupling element that is aligned with the machine for the treatment of semiconductors.

U.S. Pat. No. 4,840,530 shows a device for transporting semiconductor substrates from a substrate carrier, incorporated into a facility for treating substrates, into a carrier provided for further transport and vice versa.

SUMMARY OF THE INVENTION

The object of the invention is the development of a device and a method that provide treatment of substrates in a fluid container and loading and unloading of the fluid container in a safe and reliable manner with simple constructive devices and, in particular, with a minimum of time expenditures, so that the productivity of a device of this kind is improved.

The described object of the invention is inventively solved by a second substrate transport device that is rigidly connected to and reciprocatingly movable with the first transport device. With a second substrate transport device, it is possible to considerably accelerate the transfer of the substrates in the fluid container by loading the second substrate transport device with substrates and/or with another substrate package to be treated, while the first substrate package is still being treated. A double substrate transport device of this kind is also particularly simple in its design so that the additional expenditures for the second substrate transport device are minimal in comparison to the considerably higher productivity rate. Because the second substrate transport device allows the loading and unloading of the substrate transport device separate and removed from the treatment location itself, it also increases the transport safety, thus achieving lower reject rates.

It is especially advantageous to provide the two rigidly connected substrate transport devices with a common device for the simultaneous movement of the transport devices. Accordingly, the mechanical actuating devices for the movement of the substrate transport devices are not anymore complicated than the embodiment with only one substrate transport device.

According to another especially advantageous embodiment of the invention, at least one loading and/or unloading station for loading and/or unloading of the transport device is provided, wherein it is especially advantageous to provide one loading and/or unloading station on each side of the fluid container.

The at least one loading and/or unloading station advantageously comprises a device for drying a substrate carrier, from which the substrates are transferred into the transport device or into which the substrates are loaded from the transport device. In this manner, it is possible to reuse the substrate carriers after removal of wet or moist substrates for immediate receiving of treated and dried substrates after completion of the drying process.

According to an especially advantageous embodiment of the invention, the substrate support devices of the substrate transport devices comprise at least one rotatable stay bar that, depending on its turned position, locks or releases the substrates in the substrate transport device. This embodiment of the substrate transport device and the substrate support device is described in detail in DE-A-196 15 969, which application has not been published as of the filing date of this application and is incorporated by reference into the present patent application to avoid repetition concerning this embodiment.

It is especially advantageous to embody the transport devices as hoods, wherein two walls of the hood opposite from each other advantageously comprise slots for the substrates in which the substrates are held in their position parallel to one another when they are pushed into the hood, removed from the hood, and/or locked in the hood. The hood is preferably a processing hood, comprising, in particular, inlet openings for at least one fluid to allow a drying process according to the Marangoni method. To avoid repetition according this embodiment, reference is made to DE-A-195 46 990, DE-A-196 15 970, or DE-A-196 37 875 of the same applicant, which applications have not been published as of the filing date of this application and are incorporated by reference into the present patent application.

The object of the invention is also solved by a method for the treatment of substrates in a fluid container with a first substrate transport device and a second substrate transport device according to one of the preceding claims, such that the substrates are treated in the substrate transport device that is positioned above the fluid container, while the other substrate transport device is unloaded and/or loaded with substrates. In this manner, the inventive method and the inventive device allow loading and/or unloading of the other substrate transport device of the inventive double transport device simultaneously to the treatment process of the substrates. The entire process is substantially accelerated, and, in comparison to conventional devices, the productivity of the entire facility is substantially increased. Because the loading and unloading process according to the invention is, in comparison to conventional devices, not performed above the fluid container, but away from it, it is also possible to embody the device itself simpler and run the loading and unloading process safer and more reliably, thus achieving a lower reject rate.

Although the inventive device can also be advantageously used with only one loading and unloading device on one side of the fluid container only, it is especially advantageous to provide a loading and unloading device on each side of the fluid container. In this case, it is especially advantageous, when the process comprises the following steps:

a) Removal of the substrates from the fluid container into a first substrate transport device and simultaneous loading of a second substrate transport device that is positioned above a loading and/or unloading station. The substrates are supported and locked in the first and second substrate transport devices.

b) Transfer of the two substrate transport devices into a position, in which the first substrate transport device is positioned above a first loading and/or unloading station and the second substrate transport device is positioned above the fluid container. If during the treatment process the substrate transport device, which is preferably embodied as a process hood, has to provide a tight seal above the fluid container toward the outside, it is advantageous to lift the two substrate transport devices slightly before moving or displacing them and to perform their movement thereafter.

c) Simultaneous unloading of the substrates from the first substrate transport device into a substrate carrier, positioned in the first loading and/or unloading station, and of the substrates from the second substrate transport device into the fluid container.

d) Transfer of the two substrate transport devices into a position, in which the first substrate transport device is positioned above the fluid container and the second substrate transport device is positioned above the second loading and/or unloading device.

This process sequence may be repeated unlimited times and provides a short process cycle with high productivity.

When the substrate transport devices are embodied in the form of hoods, i.e., in the shape of a double hood, having rotatable stay bars for the substrate support devices according to DE-A-196 15 969, it is advantageous to lock the substrates during the process step a) and/or after the process step a) by turning the stay bar of the first and second transport devices into a first substrate-locking position and to release the substrates during the process step c) and/or after the process step c) by turning the stay bar of the first and second transport devices into a second substrate-releasing position.

According to another advantageous embodiment of the invention, the substrates are dried during process step a) while being lifted out of the fluid container into the first substrate transport device. A drying process of this kind is described, for instance, in DE-A-44 13 077 and the German patent applications of the same applicant mentioned previously, which applications have not been published as of the filing date of this application.

According to another advantageous embodiment of the inventive method, in particular, when the so-called Marangoni drying method is applied during lifting of the substrates out of the fluid container into the transport device embodied as a hood, a gas is introduced into the hood.

According to another advantageous embodiment of the inventive method, a substrate carrier is dried in the first and/or second loading and/or unloading stations after loading of the first and/or second transport devices, i.e., when the substrate carrier holds no substrates. For this purpose, a drying gas is advantageously blown onto the substrate carrier.

BRIEF DESCRIPTION OF THE DRAWINGS

The invention is disclosed in the following with the aid of a preferred embodiment in reference to a single figure that schematically shows an embodiment of the inventive device in cross-section.

DESCRIPTION OF PREFERRED EMBODIMENTS

The only figure schematically shows a fluid container 1 comprising a first loading and/or unloading station 2 on one side and a second loading and/or unloading station 3 on the other side, having a schematically shown substrate lifting and/or lowering device 4 and 5, respectively.

A first substrate transport device 6 is positioned above the first loading and/or unloading station 2, and a second substrate transport device 7 is positioned above the fluid container 1, both embodied as a hood. The hoods 6,7 are rigidly connected to one another by a connecting element 8.

The second loading and/or unloading station 3 additionally comprises a schematically indicated substrate carrier drying device 9 for blowing a drying gas onto substrate carrier 10, also shown schematically.

The fluid container 1 comprises a support device 11 in the shape of a knife-like bar that provides the lifting of the substrates 12 into and out of the fluid container 1. Examples of the embodiments of the fluid container 1 and the support device 11 are described in DE-A-44 013 077 or the previously mentioned applications of the same applicant, which applications have not been published as of the filing date of this application and are incorporated by reference into the present patent application to avoid repetition concerning this embodiment.

In the shown embodiment, the hoods 6,7 are embodied as processing hoods and, therefore, are provided with inlet openings 13 and distribution openings 14,15 for the introduction of a drying gas, for instance, a mixture of nitrogen and isopropyl alcohol into the hood 6 and 7 to improve and accelerate the drying process according to the Marangoni method during lifting of the substrates 12 out of the fluid container 1.

The hoods 6, 7 also comprise slots 16, 17 in the respective side walls, where the substrates 12 are guided and supported during lifting and lowering. One wall 18, 19 of the hood 6, 7 is provided with a respective substrate support device 20, 21 in the shape of a rotatable, stay bar.

The hood 6 and/or 7, used as a substrate transport device, and the substrate support devices in the hoods 6 and 7, embodied as a rotatable stay bar, as well as the functional operation of these devices are described in detail in DE-A-196 15 969, which application has not been published as of the filing date of this application and is incorporated by reference into the present patent application to avoid repetition concerning this embodiment.

The function of the inventive device according to the embodiment shown in the only figure is described below.

At the point in time of the process shown in the figure, the rotatable stay bars 20, 21 of the hoods 6, 7 are located in the second substrate-releasing position, so that they are lowered into the fluid container 1 in the first loading and/or unloading station 2 from the hood 6 by the substrate lifting device 4 or from the hood 7 by the knife-like bar 11.

The treated and/or dried substrates 12 removed from the hood 6 are then transferred to a non-represented substrate carrier underneath the hood 6 to transfer the treated substrates to another treatment station or to another process step.

After the substrates 12 have been fully lowered into the first loading and unloading station 2 or into the fluid container 1, the double hood 6, 7, 8 is moved in the direction of the arrow 22 until the first hood 6 is positioned above the fluid container 1 and the second hood 7 is positioned above the second loading and unloading station 3.

Before the double hood 6, 7, 8 is moved in the direction of arrow 22, it can be slightly lifted and lowered after completion of the movement. In this manner, it is possible to seal the transition area between the fluid container 1 and the hood 6 or 7, which may improve the treatment process.

When the hood 6 is positioned above the fluid container 1 and, accordingly, the hood 7 above the second loading and/or unloading station 3, the knife-like bar 11 is moved upwardly in the fluid container 1, so that the substrates 12 are pushed into the slots 16 of the first hood 6 until they are positioned over the stay bar 20. During lifting of the substrates out of the fluid container 1, a drying process is carried out, which is accelerated by introducing a gas into the first hood 6 according to the Marangoni method. Simultaneously with the loading of the first hood 6 above the fluid container 1, the second hood 7, that is positioned above the second loading and/or unloading device 3, is also loaded with the substrates 12 to be treated by lifting the substrates 12 with the substrate lifting and/or lowering device 5 out of a substrate carrier 10 and pushing them so far into the second hood 7 that they are positioned above the rotatable stay bar 21 and locked by turning the stay bar into the first substrate-locking position.

Subsequently, the movement of the double hood 6, 7, 8 occurs in the opposite direction of arrow 22, so that, as shown in the figure, the first hood 6 is again positioned above the first loading and/or unloading station 2 and the second hood 7 is positioned above the fluid container 1. The knife-like bar 11 in the fluid container 1, as well as the substrate lifting and/or lowering device 4 of the first loading and/or unloading stations 2, are then raised to the top position. By turning the stay bars 20, 21 into the second substrate-releasing position, the substrates are lowered out of the hoods 6, 7 and placed into a non-represented substrate carrier in the first loading and/or unloading station 2 or fully submerged in the treatment fluid of fluid container 1.

The double hood 6, 7, 8 is then moved into a position, in which the first hood 6 is positioned above the fluid container 1 and the second hood 7 is positioned above the second loading and unloading station 3. The described process sequence may be repeated unlimited times.

The invention has been disclosed above with the aid of a preferred embodiment. However, persons skilled in the art may be able to implement various alterations, designs and modifications without departing from the gist of the invention. Although the device and method have been disclosed with the aid of a drying process, the inventive device and the inventive method are also suitable for the transport of substrates in conjunction with other treatment processes.

The present invention is, of course, in no way restricted to the specific disclosure of the specification and drawings, but also encompasses any modifications within the scope of the appended claims.

What I claim is:

1. A device for the treatment of substrates (12), said device comprising:

a fluid container (1);

two substrate transport devices (6, 7) positionable above said fluid container (1); each one of said two substrate transport devices (6, 7) embodied as a hood for receiving multiple substrates by lifting said multiple substrates (12) into said substrate transport devices (6, 7) and for releasing said multiple substrates (12) by lowering said multiple substrates (12) out of said substrate transport devices (6, 7);

each one of said two substrate transport devices (6, 7) having at least one substrate support device (20, 21), said substrate support device (20) having a first position for locking the substrates (12) and having a second position for releasing the substrates (12);

said substrate transport devices (6, 7) rigidly connected to one another and linearly movable for alternatingly positioning one of said substrate transport devices (6, 7) above said fluid container (1).

2. A device according to claim 1, comprising a common device for simultaneously moving said two substrate transport devices (6, 7).

3. A device according to claim 1, further comprising at least one substrate loading/unloading station (2, 3) for loading and unloading the substrates (12) into said two substrate transport devices (6, 7).

4. A device according to claim 3, wherein said at least one loading/unloading station (2, 3) comprises a device (9) for drying a substrate carrier (10) in which the substrates (12) are carried.

5. A device according to claim 3, wherein said loading/unloading stations (2, 3) comprise a respective substrate lifting and/or lowering device (4, 5) for lifting the substrates (12) out of or lowering the substrates (12) into said substrate transport device (6, 7).

6. A device according to claim 1, wherein each one of said substrate support devices (20, 21) comprises at least one rotatable stay bar (20, 21).

7. A device according to claim 6, wherein said stay bars (20, 21) have a first substrate-locking position and a second substrate-releasing position and wherein said stay bars (20, 21) are rotatable between said first and second positions.

8. A device according to claim 7, wherein said two substrate transport devices (6, 7) each have two opposed walls with slots (16, 17) for receiving the substrates (12).

9. A device according to claim 8, wherein said stay bars (20, 21) comprise slots for the substrates (12) extending perpendicularly to a longitudinal extension of said stay bars (20, 21), wherein the substrates (12) rest in said slots of said stay bars (20, 21) in said substrate-locking first position.

10. A device according to claim 1, wherein said two substrate transport device (6, 7) are processing hoods having inlet openings (13) for at least one fluid.

11. A method for handling substrates (12), said method comprising the steps of:

providing a fluid container (1) having a first and a second substrate transport devices (6, 7) coordinated therewith, wherein the first and second substrate transport devices (6, 7) are hoods configured to accommodate multiple substrates;

moving the first and second substrate transport devices (6, 7) alternatingly into a first position above the fluid container (1) and a second position above a loading/unloading station remote from the fluid container;

loading or unloading substrates (12) by lifting said multiple substrates (12) into or by lowering said multiple substrates (12) from said first or second substrate transport device (6, 7) positioned in said first position while simultaneously loading or unloading substrates (12) into or from said first or second substrate device (6, 7) positioned in said second position.

12. A method for handling substrates (12), said method comprising the steps of:
    a) removing the substrates (12) by lifting from a fluid container (1) into a first substrate transport device (6), embodied as a hood and positioned above the fluid container, and simultaneously loading substrates (12) by lifting into a second substrate transport device (7), embodied as a hood and positioned above a second loading/unloading station;
    b) linearly transferring the two substrate transport devices (6, 7) into positions, in which the first substrate transport device (6) is positioned above a first loading/unloading stations and the second substrate transport device (7) is positioned above the fluid container (1);
    c) simultaneously unloading the substrates by lowering from the first substrate transport device (6) into a substrate carrier of the first loading/unloading stations (2) and the substrates (12) from the second substrate transport device (7) into the fluid container (1);
    d) linearly transferring the two substrate transport devices (6, 7) into a position, in which the first substrate transport device (6) is positioned above the fluid container (1) and the second substrate transport device (7) is positioned above a second loading and/or unloading device (3);
    e) repeating steps a) through d) as needed.

13. A method according to claim 12, further comprising the step of locking substrates (12) received in the first or the second substrate transport device (6, 7) by turning a stay bar (20, 21) provided at the first or second substrate transport device into a first substrate-locking position.

14. A method according to claim 13, further comprising the step of releasing the substrates (12) from the first or second substrate transport device by turning the stay bars (20 or 21) into a second substrate-releasing position.

15. A method according to claim 12, wherein during process step a) the substrates (12) are dried while being lifted out of the fluid container (1) into the first substrate transport device (6) positioned above the fluid container (1).

16. A method according to claim 15, wherein during lifting of the substrates (12) out of the fluid container (1) a gas is introduced into the first substrate transport device (6).

17. A method according to claim 12, further comprising the step of drying a substrate carrier (10) of the second loading/unloading station (3) after loading the substrates (12) from the substrate carrier into the second transport device (7).

18. A method according to claim 17, further comprising the step of blowing a drying gas onto the substrate carrier (10).

* * * * *